United States Patent [19]

Kumeji et al.

[11] Patent Number: 5,543,755
[45] Date of Patent: Aug. 6, 1996

[54] INDICTIVE COMPONENT WITH ZIG ZAG PARTS AND AN OPENING IN THE EXTERIOR MOLD

[75] Inventors: Yasushi Kumeji, Kadoma; Seiichi Nishimura, Hirakata; Yoshinobu Nakajima, Katano; Makoto Itou, Toyooka, all of Japan

[73] Assignee: Matsushita Electric Industrial Co., Ltd., Osaka, Japan

[21] Appl. No.: 430,849

[22] Filed: Apr. 28, 1995

Related U.S. Application Data

[62] Division of Ser. No. 135,291, Oct. 12, 1993, Pat. No. 5,446,428.

[30] Foreign Application Priority Data

Oct. 12, 1992 [JP] Japan .................. 4-272699
Mar. 26, 1993 [JP] Japan .................. 5-67833
Jun. 30, 1993 [JP] Japan .................. 5-162131

[51] Int. Cl.⁶ .................................................. H03H 7/01
[52] U.S. Cl. .................................... 333/185; 336/205
[58] Field of Search .............................. 333/175, 177, 333/181, 185; 336/223, 225, 205, 232

[56] References Cited

U.S. PATENT DOCUMENTS

| | | | |
|---|---|---|---|
| 2,568,169 | 9/1951 | Raczynski | 336/223 |
| 3,636,481 | 1/1972 | Boulin et al. | 333/185 |
| 3,678,419 | 7/1972 | Boulin et al. | 333/185 |
| 4,095,199 | 6/1978 | Behn et al. | 333/167 |
| 5,023,578 | 6/1991 | Kaneko et al. | 333/185 |
| 5,034,710 | 7/1991 | Kawaguchi | 333/185 |
| 5,150,086 | 9/1992 | Ito | 333/182 |
| 5,151,054 | 9/1992 | Briones et al. | 333/185 X |
| 5,158,482 | 10/1992 | Tan et al. | 333/185 X |
| 5,198,138 | 3/1993 | Yamamoto et al. | 252/62.54 |
| 5,374,907 | 12/1994 | Orita et al. | 333/181 |

FOREIGN PATENT DOCUMENTS

| | | | |
|---|---|---|---|
| 3634159 | 4/1987 | Germany . | |
| 60-15905 | 1/1985 | Japan . | |
| 60-85616 | 5/1985 | Japan | 333/181 |
| 63-261906 | 10/1988 | Japan . | |
| 1-27305 | 1/1989 | Japan . | |
| 1215107 | 8/1989 | Japan . | |
| 3262312 | 11/1991 | Japan | 333/185 |
| 4151810 | 5/1992 | Japan | 336/232 |

*Primary Examiner*—Benny Lee
*Assistant Examiner*—Justin P. Bettendorf
*Attorney, Agent, or Firm*—Ratner & Prestia

[57] ABSTRACT

An electronic component comprises an inductive element which includes a pair of zigzag parts, a pair of first terminals connected to one side of the zigzag parts, a connection part connected to the other side of the zigzag parts, an electrode disposed in the middle of the connection part, a second terminal provided on the extensional position of the electrode, and an exterior mold having a gap in the middle in order to expose the fronts of electrode and second terminal.

10 Claims, 18 Drawing Sheets

INDICTIVE COMPONENT WITH ZIG ZAG PARTS AND AN OPENING IN THE EXTERIOR MOLD

This application is a division of application Ser. No. 08/135,291, filed Oct. 12, 1993, now U.S. Pat. No. 5,446,428.

FIELD OF THE INVENTION

The present invention relates to an electronic component such as inductive component and LC filter used in various electronic appliances and a method of manufacturing such an electronic component.

BACKGROUND OF THE INVENTION

Prior art inductive elements are shown in FIG. 24 (a) to FIG. 24 (c).

In the drawings, a plate material such as iron alloy was blanked to form a zigzag part 1 in the middle, and straight terminal parts 2 were provided at both ends of the zigzag part 1.

Prior LC filters are shown in FIG. 25 (a) to FIG. 25 (d).

In FIG. 25 (a), a U-shaped lead wire 4 was inserted into a pair of tubular sintered ferrite cores 3, and a capacitive element 5 with a lead was connected to the middle of the lead wire 4. In FIG. 25 (b), using a formed bobbin 8 having brims 6, 7 at both ends and in the middle, leads for external connection 9 were inserted into the brims 6 at both ends of the formed bobbin 8, a capacitive element 11 with leads was inserted into a indented part 10 of the middle brim 7, windings 12 were wound between the brims 6 and 7 of the formed bobbin 8, outgoing wires of the windings 12 were wound around the leads for external connections 9 and the lead of the capacitive element 11 was connected by soldering to the windings 12.

The prior art LC filter shown in FIG. 25 (c) includes a pair of drum cores 14 having a coil 13, and a capacitive element 15 having a pair of axial leads. An axial lead is connected to the coil.

In FIG. 25 (d), after forming four penetration holes 16 in a U-shaped ferrite core 17, lead wires were inserted into the penetration holes 16, and the penetration holes 16 were interconnected with conductors 18 to form an inductive element, while a capacitive element 19 was disposed in a indented part of the U-shaped ferrite core 17 to connect with the conductors 18, thereby forming an LC filter. The prior LC filters were generally molded with resin or encased with resin box.

The prior inductive components, LC filters and other electronic components were manufactured as shown in FIG. 26 (a) to FIG. 26 (d).

In accordance with the drawings, an electric conductive hoop 21 was blanked in an electronic component element 20 to form a terminal plate 22, which was bent, connected and set in molding dies 23. Resin was then poured into the molding dies 23 so as to be formed into the state as shown in FIG. 26 (b). The electric conductive hoop 21 and terminal plate 22 were next cut off and separated to manufacture an intermediate part as shown in FIG. 26 (c). The terminal plate 22 was then bent along the flank of an exterior mold 24, thereby fabricating an electronic component for surface mounting as shown in FIG. 25 (d). That is, the electronic component manufactured by this method possessed a pair of terminals 22 having bottom terminals 22a and side terminals 22b on the flanks of the exterior mold 24. When forming the exterior mold, the resin deposited on the surface of the bottom terminal 22a and burrs were formed. As a result, serious interference with soldering occurred when mounting on the surface of the electric circuit. Thus a deburring process was needed. As a result, the productivity was low. In addition, the terminal plate 22 was first separated from the electric conductive hoop 21 and then bent along the side surface from the corner of the exterior mold 24. In this case, the bent part was not square due to spring-back of the terminal plate 22. Furthermore, either the side terminal 22b was cleared from the flank of the exterior mold 24 or the bottom terminal 22a was lifted from the bottom of the external mold 24. Therefore, surface mounting quality was impaired, and the soldering performance with regard to mounting was poor.

Accordingly, as shown in FIG. 27, it was proposed to compose molding dies 25 to as to draw out the terminal plate 22 vertically from the bottom of the exterior mold 24. However, this method requires high precision processing of the drawing part of the terminal plate 22 of the molding dies 25. Furthermore, the terminal plate 22 of the electric conductive hoop 21 is typically preliminarily bent in square direction, and the terminal plate 22 could not be bent completely at a right angle. Moreover, as shown in FIG. 28 (a) to FIG. 28 (d), the terminal plate 22 integrated with an electric conductive hoop 21 was drawn out from the side of the exterior mold 24, the terminal plate 22 was cut off to a specified dimension from the electric conductive hoop 21 as shown in FIG. 28 (b), and separated, and then this terminal plate 22 was bent squarely as shown in FIG. 28 (c). The terminal plate 22 was further bent along the flank of the exterior mold 24, thereby forming the bottom terminal 22a and side terminal 22b.

Although the inductive element shown in FIG. 24 (a) to FIG. 24 (c) is effective as an independent inductive component when molded with resin involving magnetic powder, two inductive components are typically coupled. When further combined with a capacitive element, a large sized device was realized which required labor for assembly. Furthermore, productivity was low.

Nevertheless, by using a resin which includes magnetic powder, the magnetic coupling increases, the attenuation is enlarged, and an eddy current is generated in the capacitive element to increase the loss (tan δ), thereby increasing the trap attenuation. Furthermore, when the zigzag part 1 was molded with resin in a hollow state, the zigzag part was deformed by the resin injection pressure which resulted in the generation of of layer shorts and/or the lowering or variance of inductance. Furthermore, the stable production could not be realized.

In the LC filters shown in FIG. 25 (a) to FIG. 25 (d), labor was typically required to insert lead into the ferrite core, and plating of high reliability was typically needed. Moreover, there were many places where the outgoing wire of the winding and the leads are connected, the productivity was low, and disconnections and faulty connections were likely to occur in the connections between the outgoing wires and leads.

In the prior method of manufacturing electronic components, the inductive element was cut off and separated from the electric conductive hoop, and bent as shown in FIG. 28 (c). However, the terminal could not be set tightly along the flank of the exterior mold.

SUMMARY OF THE INVENTION

The present invention relates to an electronic component comprising an inductive element which includes a pair of zigzag parts, a pair of first terminals connected to one side of the zigzag parts, a connection part connected to the other side of the zigzag parts, an electrode disposed in the middle of the connection part, a second terminal provided on the extentional position of the electrode, and an exterior mold having a gap in the middle in order to expose the front of the electrode and the front of the second terminal. When forming the exterior mold, since the zigzag parts, terminals, connection part and electrode are held by molding dies, deformation of the zigzag parts is prevented. As a result, the fluctuation of characteristics of the inductive element is decreased, and an electronic component of high quality can be manufactured stably. In addition, since the capacitive element is incorporated within the gap of the exterior mold, the LC filter can be reduced in size. Furthermore, productivity is excellent.

In addition, by using an exterior mold made of a material including magnetic powder, because of the presence of the gap, the magnetic coupling is suppressed, and an inductive component which is small in attenuation is obtained. Furthermore, since the trap attenuation is not increased by the increase of the loss (tan δ) of the capacitive element due to eddy current, an LC filter of extremely excellent characteristics is obtained.

BRIEF DESCRIPTION OF THE DRAWINGS

FIG. 25(a) is a sectional view of a prior art electronic component for surface mounting.

DETAILED DESCRIPTION

Figure 1:
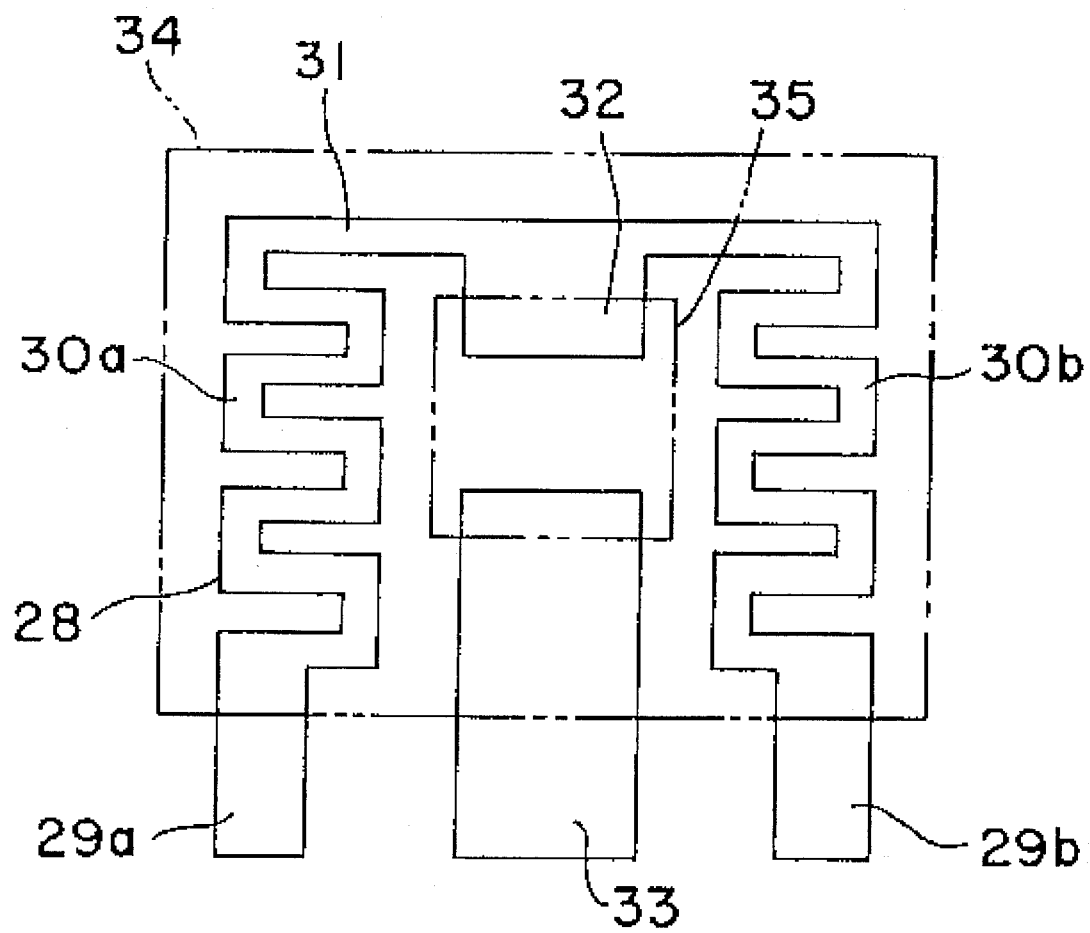
FIG. 1 is a plane view of an inductive component in accordance with an exemplary embodiment of the invention.

Referring now to the drawings, several exemplary embodiments of the present invention are described in detail below.

Referring to FIG. 1, a first inductive component is explained.

Inductive element 28 may be manufactured by blanking an electric conductive hoop made of iron alloy, copper or copper alloy. This inductive element includes a pair of zigzag parts 30*a*, 30*b*, a pair of first terminals 29*a*, 29*b* connected to one side of the zigzag parts, a connection part 31 connected to the other side of the zigzag parts, an electrode 32 disposed in the middle of the connection part, and a second terminal 33 provided on the extensional position of the electrode. An exterior mold 34 is formed by molding a resin so as to have a gap 35 in the middle in order to expose the front of the electrode and the second terminal.

Figure 2:
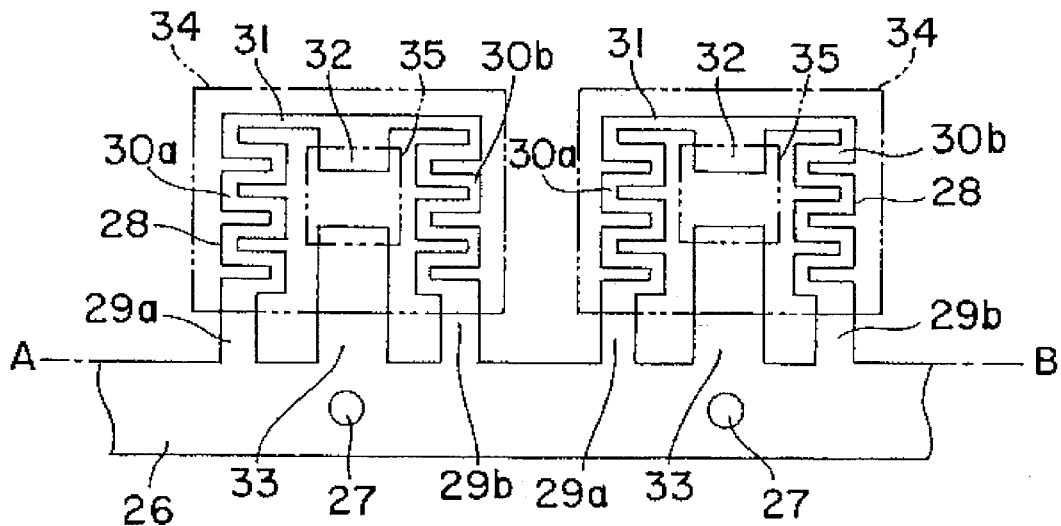
FIG. 2 is an explanatory diagram which illustrates a method of manufacturing an inductive component in accordance with an exemplary embodiment of the present invention.

In its manufacturing method, as shown in FIG. 2, feed holes 27 are provided at specific intervals on one side of the electric conductive hoop 26 made of iron alloy, copper or copper alloy, and the inductive element 28 is continuously blanked by molding dies. Consequently, by using molding dies, the exterior mold 34 have gap 35 to expose the fronts of the second terminal. The electrode is manufactured by molding a resin. Finally, the electric conductive hoop 26 is cut and separated along line A-B. According to this manufacturing method, when forming the exterior mold, since the zigzag parts, connection part and electrode are fixed by molding dies, deformation by molding pressure is extremely decreased, so that an inductive component of high quality can be manufactured.

The exterior mold 34 may be made of synthetic resin. By using a synthetic resin including magnetic powder, the impedance characteristics and noise suppressing effect of the inductive element may be enhanced.

Exemplary embodiments of the LC filter using the inductive component shown in FIG. 1 are explained in FIG. 3 to FIG. 7.

Figure 3:
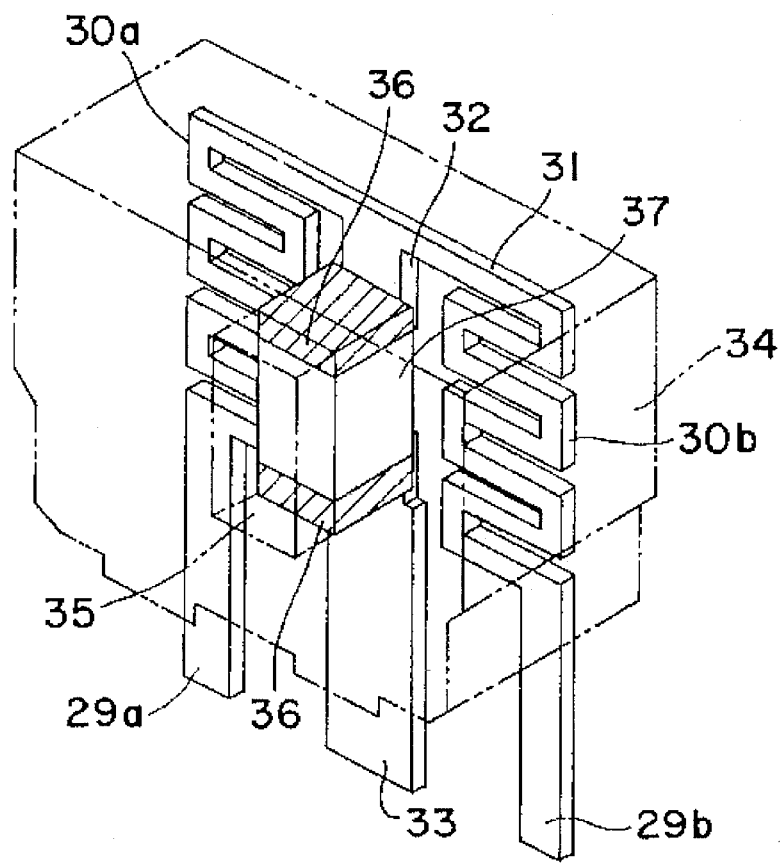
FIG. 3 is a partial perspective oblique view of an LC filter in accordance with an exemplary embodiment of the present invention.

In FIG. 3, in the gap 35 of the exterior mold 34 of the inductive component shown in FIG. 1, a ceramic chip capacitor 37 of a capacitive element having external terminals 35 at both ends is inserted, and the external terminals 36 are connected to the front of electrode 32 and second terminal 33 by soldering or other means to form an LC filter. The first terminals 29*a*, 29*b* and the second terminal 33 are drawn out from the exterior mold 34, and are directly inserted into a circuit substrate.

Figure 4:
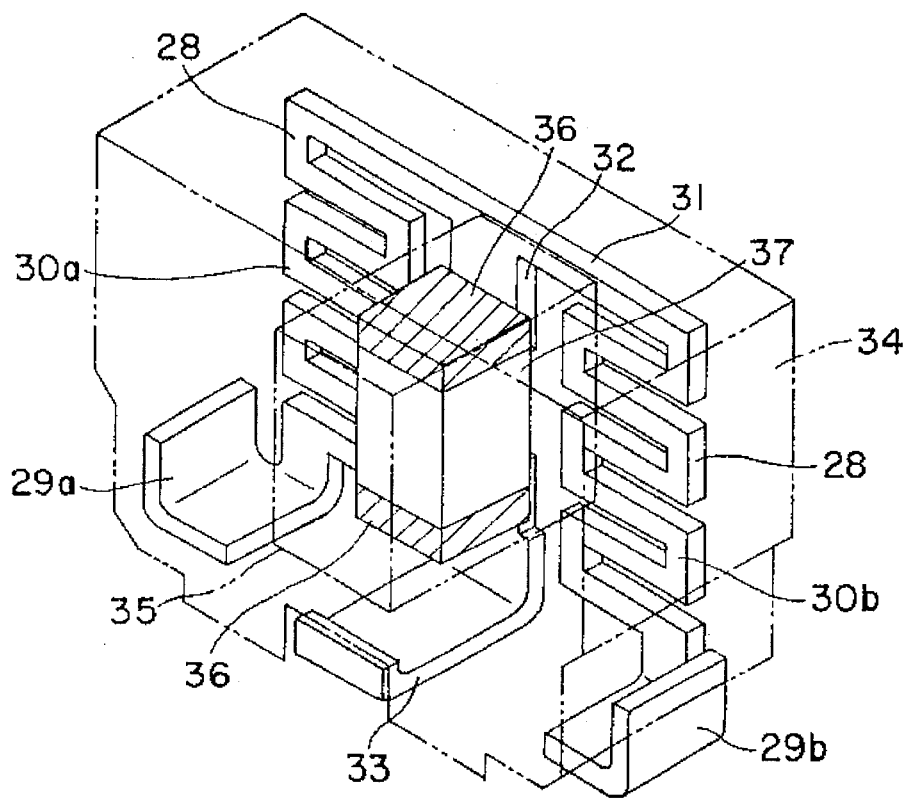
FIG. 4 is a partial perspective oblique view of an LC filter in accordance with a further exemplary embodiment of the present invention.
Figure 5:
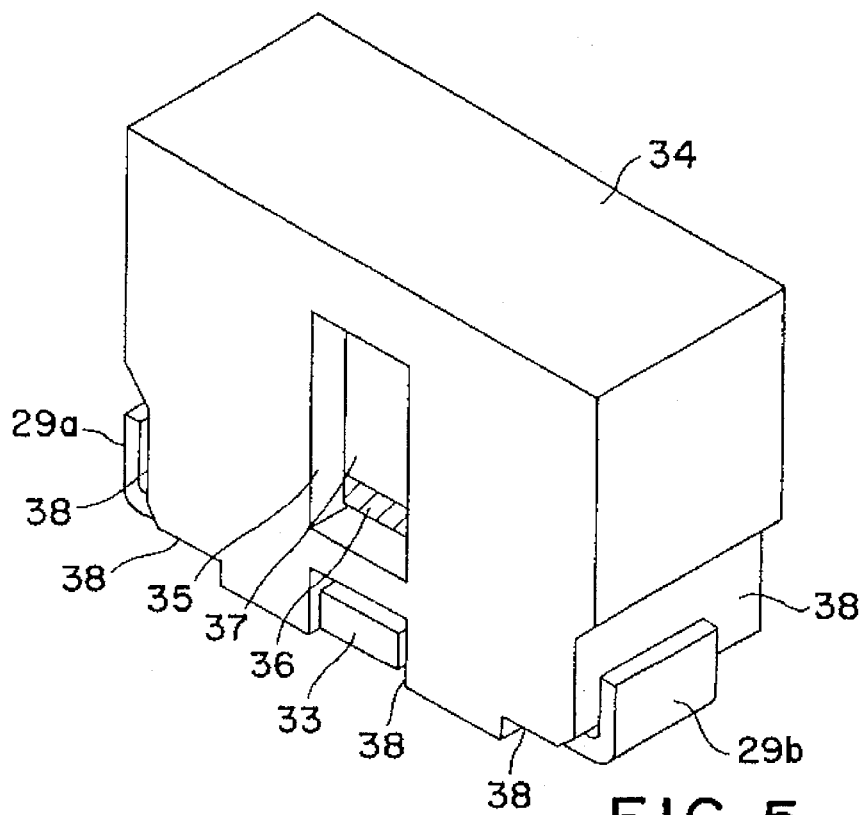
FIG. 5 is an oblique view of the LC filter shown in FIG. 4.
Figure 6:
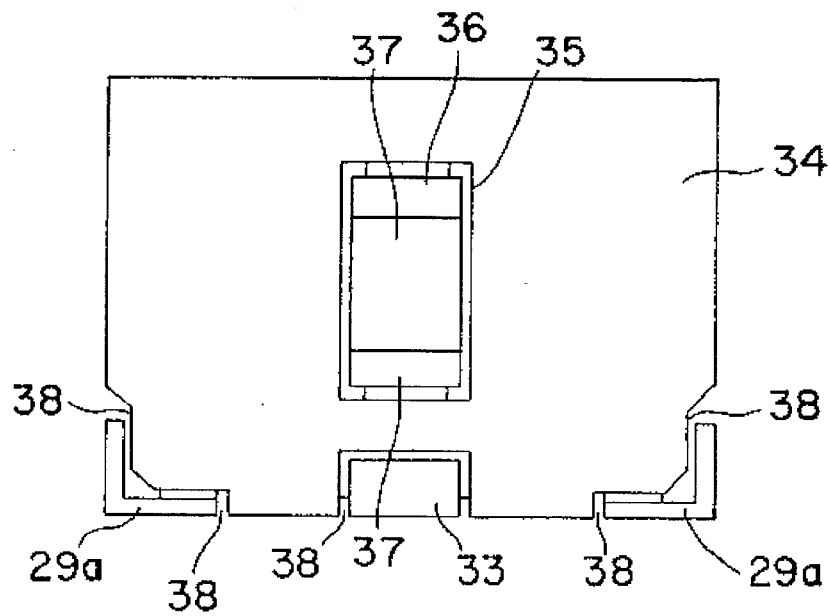
FIG. 6 is a front view of the LC filter shown in FIG. 4.
Figure 7:
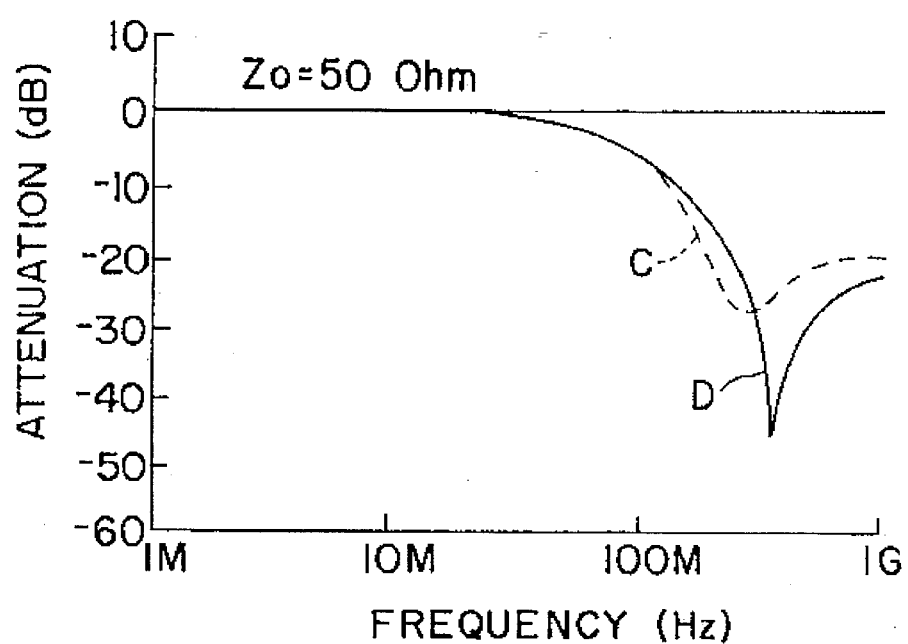
FIG. 7 is an attenuation characteristic diagram of a reference example LC filter and an LC filter in accordance with an exemplary embodiment of the present invention.

In the embodiments shown in FIG. 4 to FIG. 6, as in the embodiment in shown in FIG. 3, a ceramic chip capacitor 37 is incorporated into the gap 35 of the exterior mold 34, and connected to the front of electrode 32 and second terminal 33 by soldering or other means. The first terminals 29*a*, 29*b*, and the second terminal 33 drawn out to the lower side of the exterior mold 34 are bent along the flank of the exterior mold to form an LC filter for surface mounting. An indented part 38 is provided in the exterior mold 34, and the terminals are bent along the indented part to be disposed at the same height as the surface of the exterior mold. Thus, the LC filters shown in FIG. 4 to FIG. 6 are stably mounted for surface mounting. By using the exterior mold 34 made of resin involving magnetic powder and since a gap 35 is formed between a pair of zigzag parts 30*a*, 30*b*, the magnetic coupling is low, as a result, the attenuation is improved as shown in FIG. 7. That is, as compared with embodiment C without a gap, the attenuation is smaller in embodiment D having a gap. Moreover, since the ceramic chip capacitor is incorporated by later being inserted into the gap of the exterior mold, a gap is formed between the ceramic chip capacitor and the exterior mold. If a current flows in the ceramic chip capacitor, eddy current is not generated, and the loss (tan δ) of the ceramic chip capacitor does not increase. Thus, the trap attenuation is not enlarged.

Exemplary embodiments of the present invention for realizing stabilization in the mounting of ceramic chip capacitor are explained.

Figure 8:
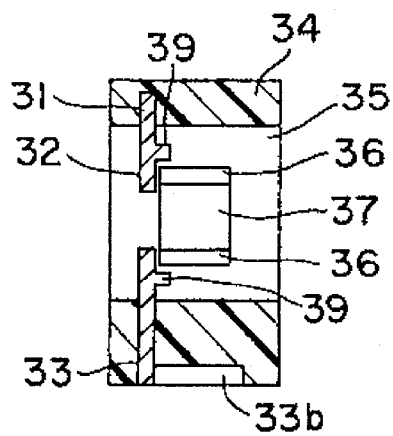
FIG. 8 is a sectional view of an LC filter in accordance with a third exemplary embodiment of the present invention.

The third exemplary embodiment of an LC filter shown in FIG. 8 includes an electrode 32 and a second terminal 33 which are exposed in the gap 35 formed in the exterior mold 34, and projections 39 for positioning the external terminals 36 of the ceramic chip capacitor 37. This configuration results in a widening of the connection area, and an enhancement of the mounting strength of the ceramic chip capacitor to the inductive element.

Figure 9:
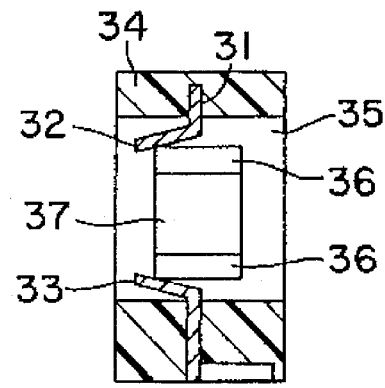
FIG. 9 is a sectional view of an LC filter in accordance with a fourth exemplary embodiment of the present invention.

The fourth exemplary embodiment of an LC filter shown in FIG. 9 comprises an electrode 32 and a second terminal which are composed of an elastic metal which are exposed in the gap 35, and a ceramic chip capacitor 37 inserted in the gap 35. The electrode 32 and the second terminal 33 are elastically deflected to hold the ceramic chip capacitor elastically, which is then soldered in this state.

Figure 10:
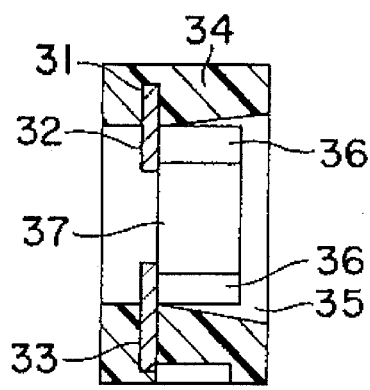
FIG. 10 is a sectional view of an LC filter in accordance with a fifth exemplary embodiment of the present invention.

In the fifth exemplary embodiment of an LC filter shown in FIG. 10, the dimensions of the gap 35 formed in the exterior mold 34 are smaller in the fixing position from the insertion side of the ceramic chip capacitor so that the ceramic chip capacitor may be inserted easily. Furthermore, when inserted up to the position of the electrode 32 and second terminal 33, the ceramic chip capacitor is press-fitted and held in the gap.

Figure 11:
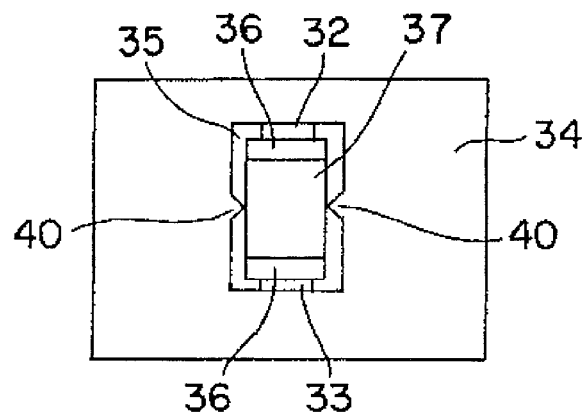
FIG. 11 is a front view of an LC filter in accordance with a sixth exemplary embodiment of the present invention.
Figure 12:
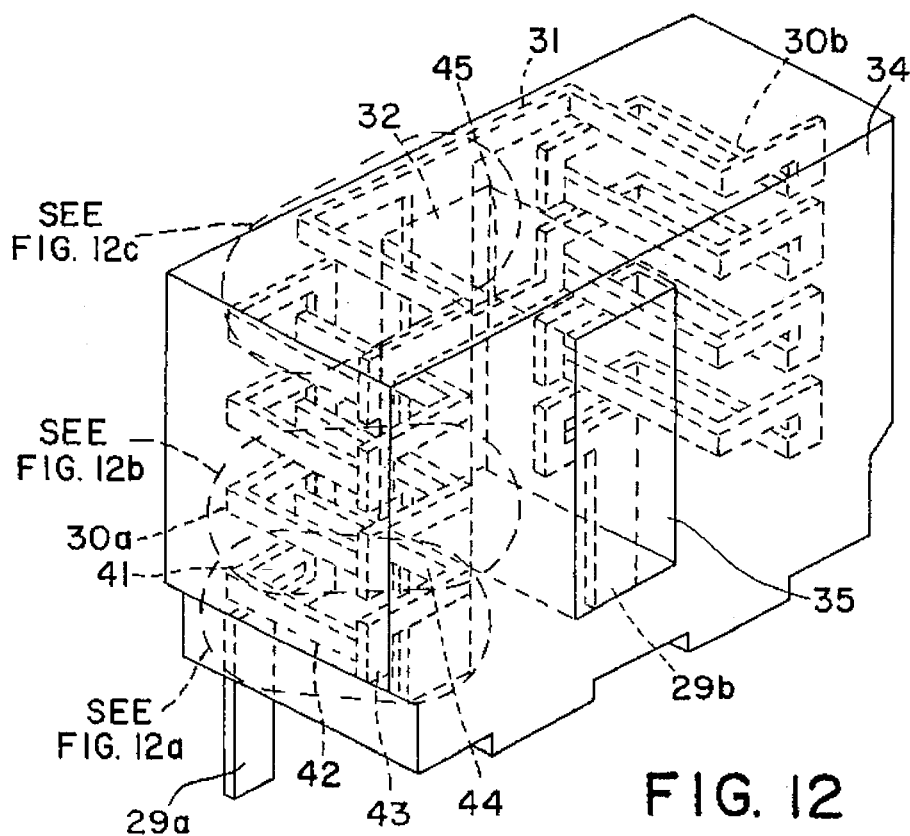
FIG. 12 is a partial perspective oblique view of an inductive component having a three dimensional inductive element.
Figure 12A:
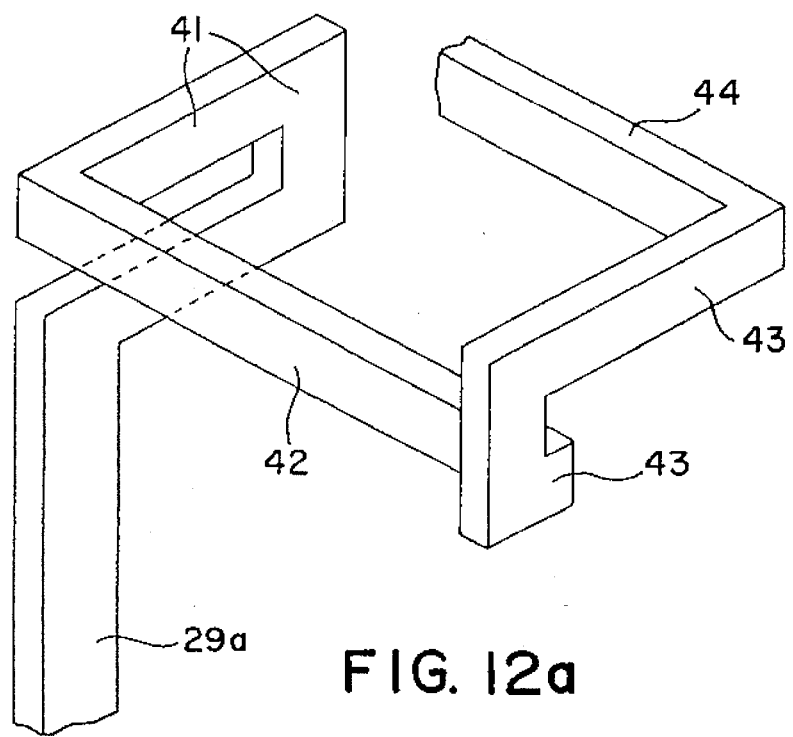
FIGS. 12(a)–12(c) are partial perspective views of the inductive elements of FIG. 12.
Figure 12B:
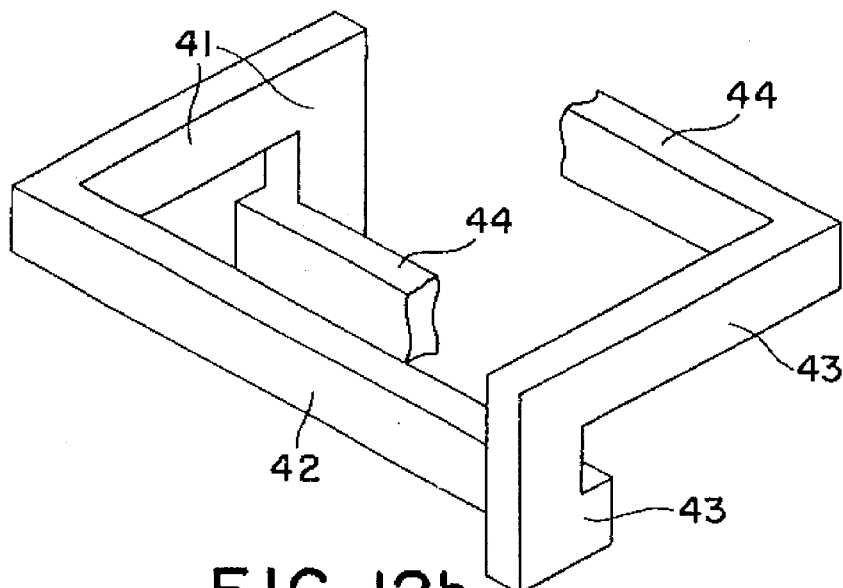
Figure 12C:
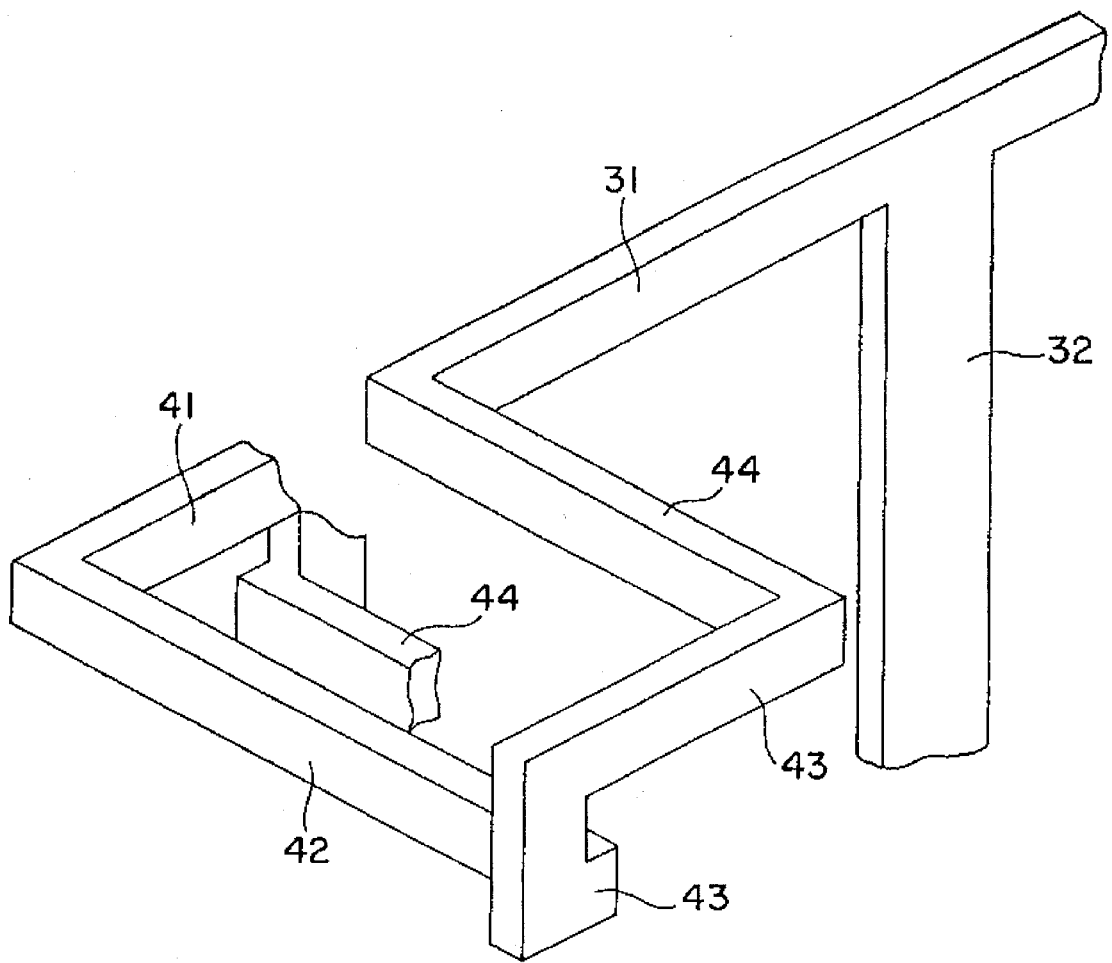
Figure 13:
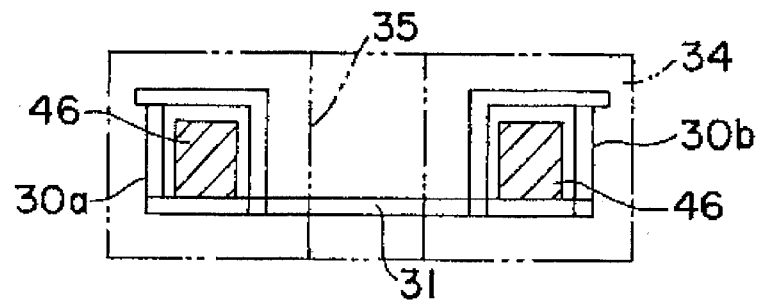
FIG. 13 is a top view of an exterior mold.
Figure 14:
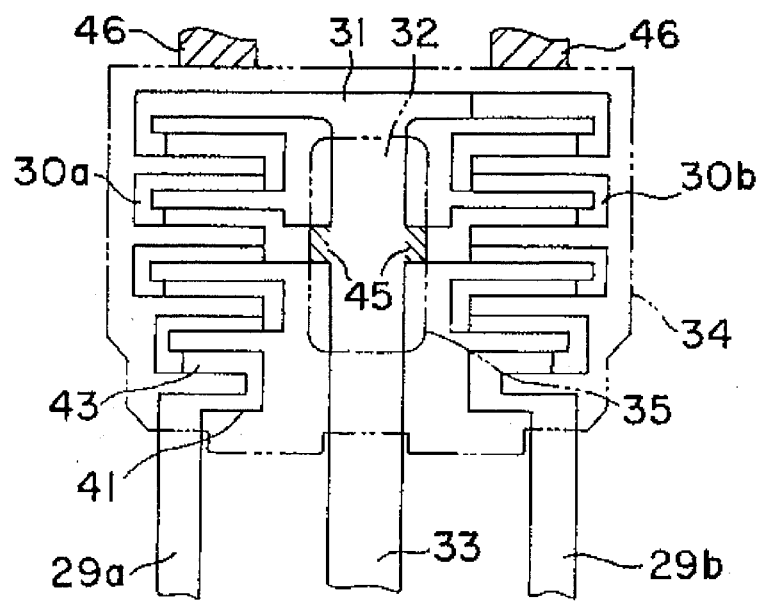
FIG. 14 is a front view of the exterior mold shown FIG. 13.
Figure 15:
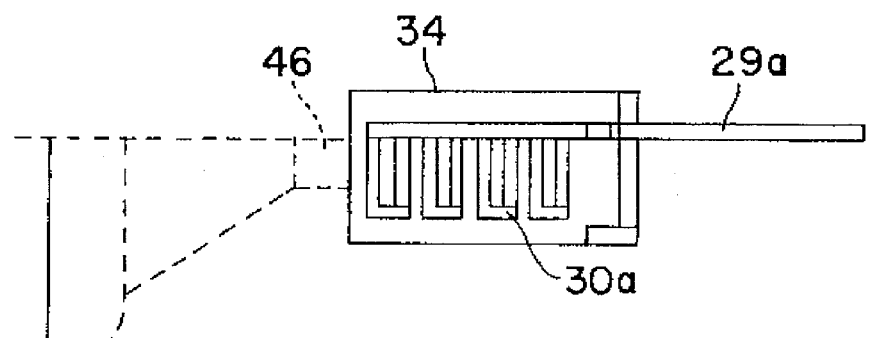
FIG. 15 is a side view of the exterior mold shown FIG. 14.
Figure 16:
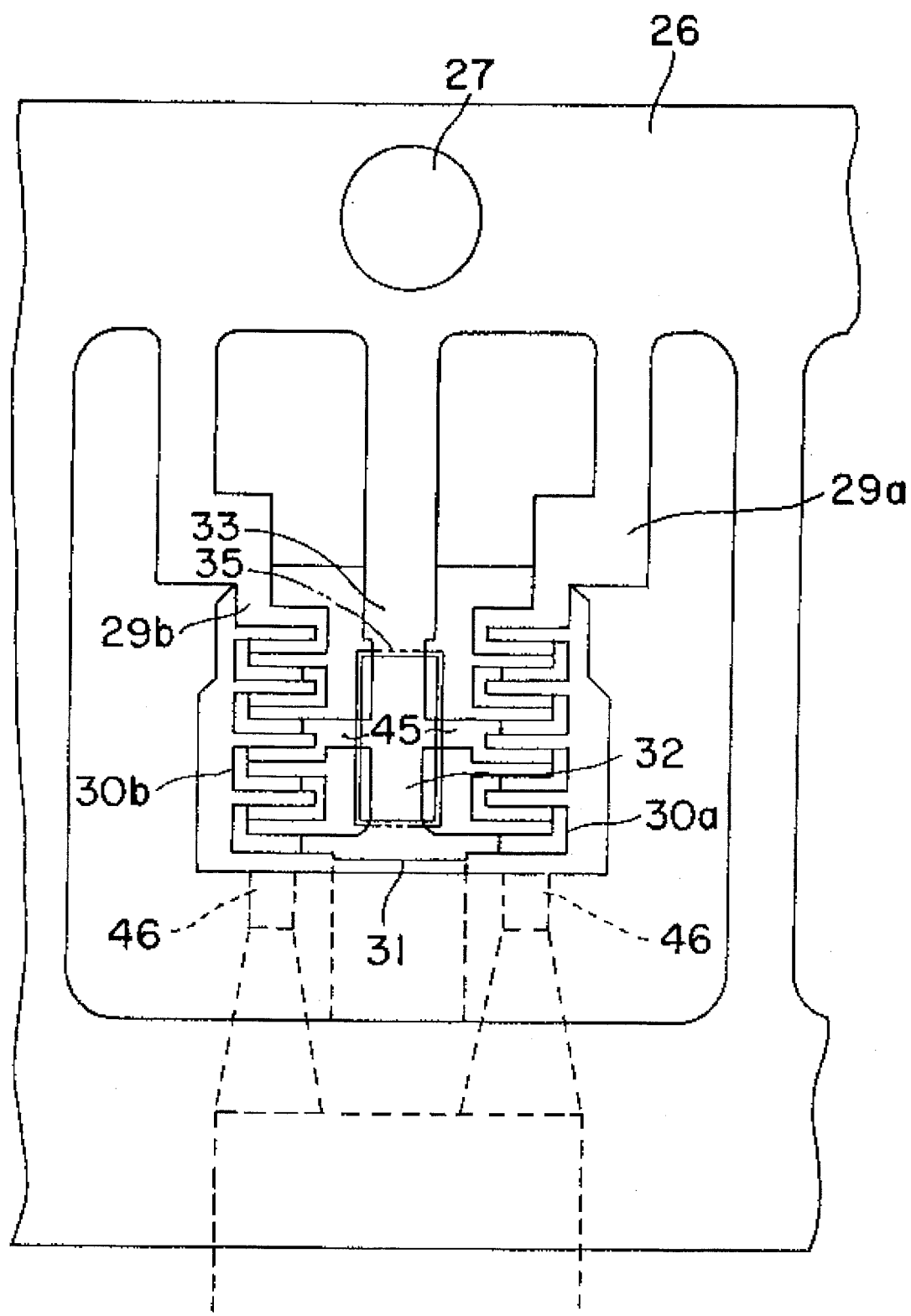
FIG. 16 is a front view of an exterior mold which is formed by using a gate in the manufacture of an inductive component in accordance with an exemplary embodiment of the present invention.

In the sixth exemplary embodiment of an LC filter shown in FIG. 11, a rib 40 is formed in the inner wall of the gap 35, and when press-fitting the ceramic chip capacitor into the gap, the ceramic chip capacitor is supported by the rib 40.

In FIG. 12 to FIG. 15, moreover, the inductance is increased by a pair of three dimensional zigzag parts. In this embodiment, an L-shaped horizontal part 41 is connected to a pair of first terminals 29*a*, 29*b*, an upward part 42 is connected to this L-shaped horizontal part, an L-shaped horizontal part 43 to this upward part, a downward part 44 to this L-shaped horizontal part, and another L-shaped horizontal part 41 to this downward part. By repeating this composition, a pair of three dimensional zigzag parts 30*a*, 30*b* is formed. The other side of a pair of zigzag parts 30*a*, 30*b* is connected to a connection part 31, an integrated assembly of electrode part 32 and second terminal 33 is disposed in the middle of the connection part 31, and a supporting part 45 extending from a part of the zigzag parts 30*a*, 30*b* is coupled to the connection part of the electrode 32 and second terminal 33, thereby forming an inductive element. These parts may be molded and formed in resin to compose an exterior mold 34 having a gap 35 for exposing electrode 32, second terminal 33, and supporting part 45. The exterior mold 34 and the gap 35 are formed by holding the three dimensional zigzag parts 30*a*, 30*b*, the electrode 32, the second terminal 33 and the supporting part 45 by molding dies. After forming the exterior mold 34, the connection part of the electrode 32, second terminal 33 and supporting part 45 are blanked in the gap 35, thereby forming an inductive component. Since the three dimensional zigzag parts 30*a*, 30*b* are weak in mechanical strength and are likely to be deformed when molding in resin, as shown in FIG. 13 to FIG. 16, the resin is injected by using molding dies having a gate 46 at the hollow parts of the three dimensional zigzag parts 30*a*, 30*b*, so that the pressure is not directly applied on the three dimensional zigzag parts 30*a*, 30*b*. After molding a resin, the first terminals 29*a*, 29*b*, and the second terminal 33 are separated from the electricconductive hoop depending on the application, and are left projected from the exterior mold 34, or may be bent along the flank of the exterior mold 34, thereby forming an inductive component.

Figure 17:
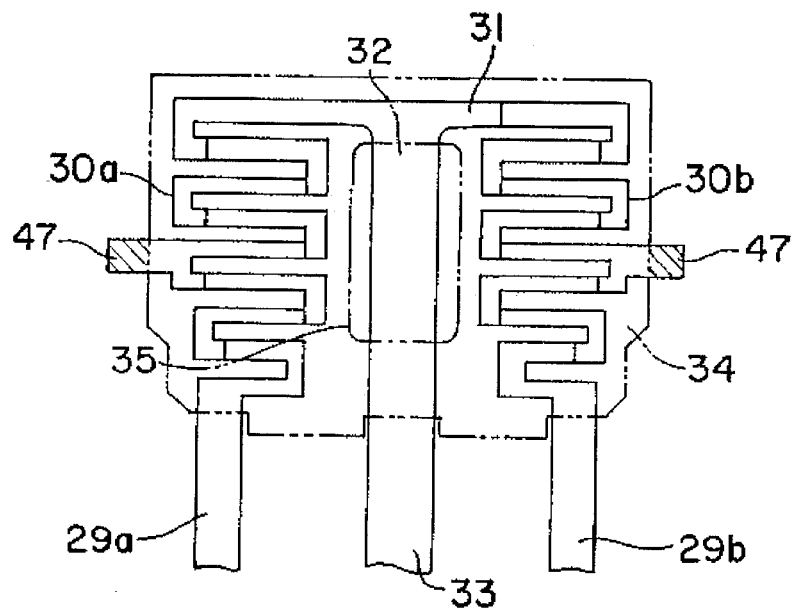
FIG. 17 is a front view of an exterior mold formed by using a supporting element.

In the exemplary embodiment shown in FIG. 17, instead of the supporting part 45, a supporting element 47 projecting outward is disposed in the middle of the three dimensional zigzag parts 30a, 30b so as to be supported by dies when molding in resin.

To use an inductive component having three dimensional zigzag parts 30a, 30b as an LC filter, a ceramic chip capacitor 37 is inserted into the gap 35 formed in the middle of the exterior mold 34, and connected by soldering to the fronts of electrode 32 and second terminal 33.

Figure 18A:
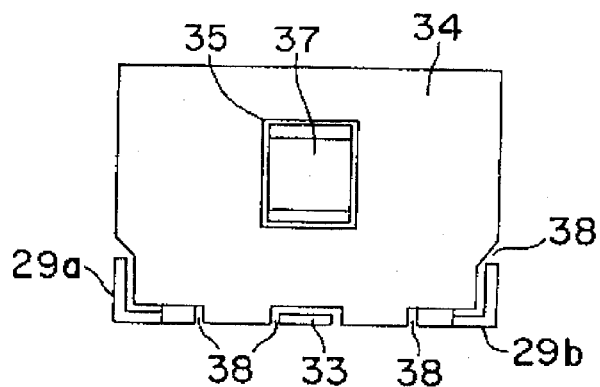
FIG. 18(a) is a front view of an LC filter for surface mounting in accordance with an exemplary embodiment of the present invention.
Figure 18B:
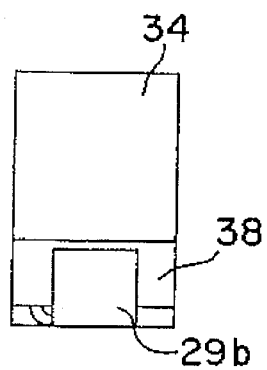
FIG. 18(b) is a side view of the LC filter shown in FIG. 18(a).
Figure 18C:
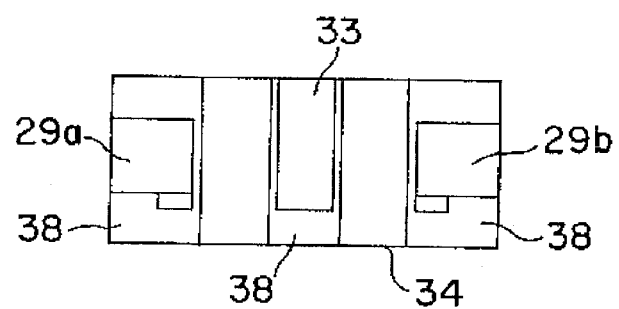
FIG. 18(c) is a bottom view of the LC filter shown in FIG. 18(a).
Figure 19A:
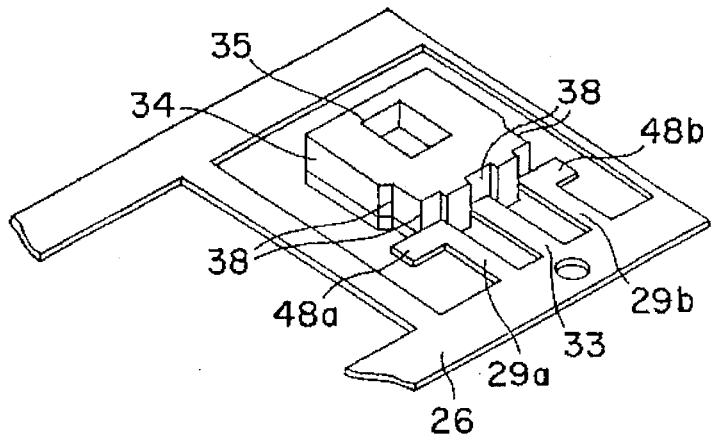
FIGS. 19(a)–(d) provides oblique views of an electronic component for surface mounting in accordance with an exemplary embodiment of the present invention.
Figure 19C:
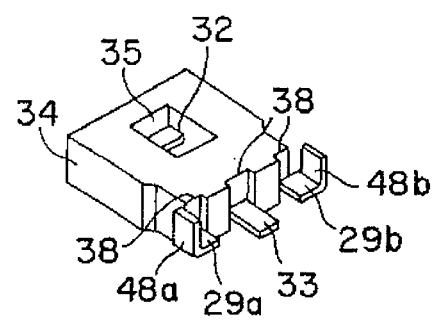
Figure 19B:
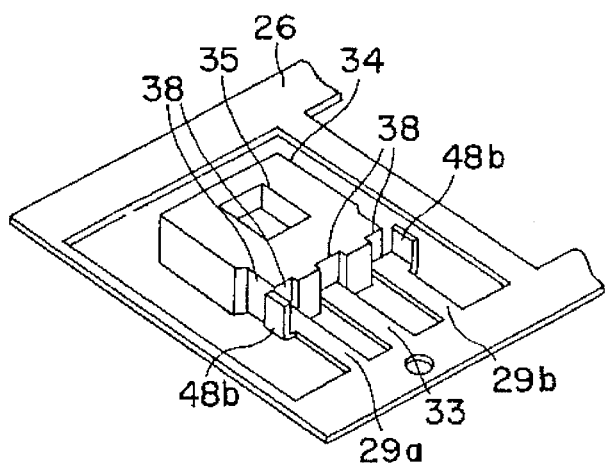
Figure 19D:
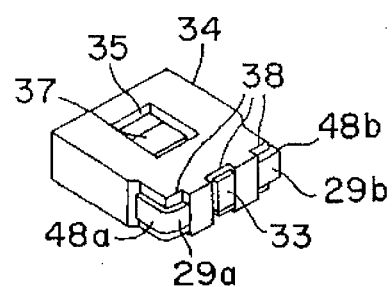
Figure 20A:
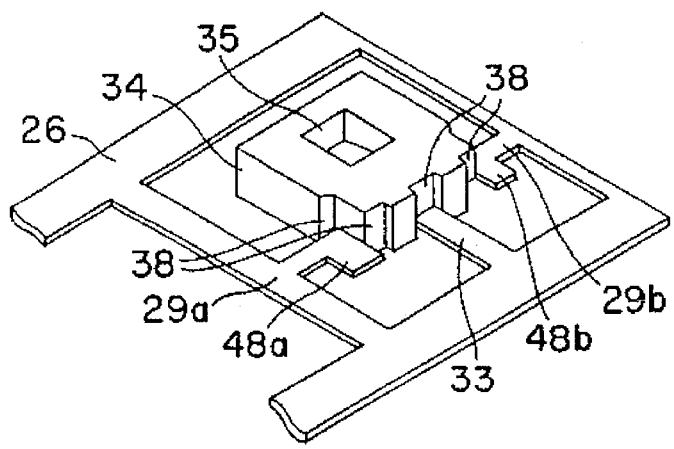
FIG. 20(a)–(d) provides oblique views of an electronic component for surface mounting in accordance with a further exemplary embodiment of the present invention.
Figure 20B:
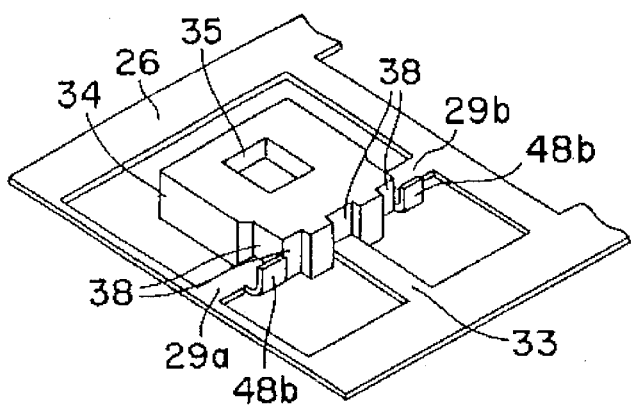
Figure 20C:
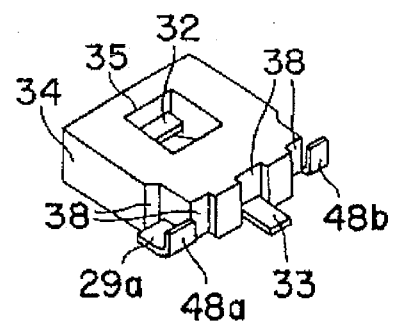
Figure 20D:
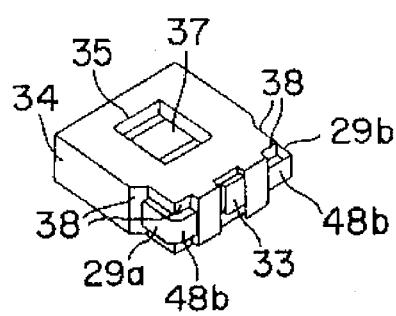

FIG. 18 (a) to FIG. 18 (c) are front, side and bottom views of an LC filter for surface mounting in an embodiment of the invention. A pair of first terminals 29a, 29b drawn out from the bottom of an exterior mold 34 are bent so as to be fitted into a dented part 38 provided in the bottom, and a pair of first terminals 29a, 29b are bent so as to be fitted into a dented part 38 formed in the lower part of the flank of the exterior mold 34. Thus, the first terminals 29a, 29b and the second terminal 33 are at the same at height as the surface the exterior mold 34 so that the surface mounting is stable. As a result, the soldering area is increased, and the mounting strength is improved.

Referring to FIG. 19 (a) to FIG. 19 (d), a method of manufacturing an electronic component for surface mounting in accordance with an exemplary embodiment of the present invention is described.

FIG. 19 (a) is an oblique view after forming the exterior mold 34 having a gap 35 by blanking an electric conductive hoop 26, and molding in resin an inductive element 28 (see FIG. 1, FIG. 2) composed of a pair of first terminals 29a, 29b, a second terminal 33, a connection part 31, and a pair of zigzag parts 30a, 30b. At this time, the first terminals 29a, 29b and the second terminal 33 drawn out from the exterior mold 34 are drawn out from the joining surfaces of molding dies, and the second terminal 33, the connection part 31, and the electrode 32 are supported using molding dies. Projections 48a, 48b rectangular to the drawing direction are integrally formed in the first terminal 29a, 29b drawn out from the both ends of the bottom of the exterior mold 34. Next, in the state of being coupled with the electric conductive hoop 26 as shown in FIG. 19 (b), the projections 48a, 48b of the first terminals 29a, 29b are bent squarely by using press dies or the like. In succession, as shown in FIG. 19 (c), the first terminals 29a, 29b and the second terminal 33 are cut off and separated from the hoop 26, leaving a specific length. At this time, the connection part of the electrode 32 and second terminal 33 is cut off simultaneously to separate into the electrode 32 and the second terminal 33. Finally, as shown in FIG. 19 (d), the first terminals 29a, 29b and the second terminal 33 drawn out from the bottom of the exterior mold 34 are folded so as to be settled in the dented part 38 formed at the flank of the exterior mold 34. At this time, the projections 48a, 48b of the first terminals 29a, 29b are settled in the dented part 38 along the flank of the exterior mold 34. Putting a ceramic chip capacitor 37 into the gap 35, the electrode 32 and the second terminal 33 are soldered to make up an LC filter.

According to the manufacturing method in accordance with the exemplary embodiment of the present invention, since the projections of the terminal are bent in the state coupled with the electric conductive hoop, it is easy to bend squarely, and the terminals can be tightly fitted in the dented part of the flank of the exterior mold when bent. Therefore, an LC filter which is excellent in both appearance and surface mounting performance is realized.

Another manufacturing method is explained below by reference to FIG. 20 (a) to FIG. 20 (d). In this exemplary embodiment, as shown in FIG. 20 (a), the first terminals 29a, 29b are drawn out from the bottom of the exterior mold 34 in the side direction, and the projections 48a, 48b are provided in the direction parallel to the drawing direction of the second terminal 33. Furthermore, the projections are bent squarely as shown in FIG. 20 (b), and the first terminals 29a, 29b, and the second terminal 33 are cut off and separated from the electric conductive hoop 26, leaving a desirable length as shown in FIG. 20 (c). The first terminals and the second terminal are then bent, and a ceramic chip capacitor is soldered to the fronts of electrode 32 and second terminal 33 in the gap 35 of the exterior mold 34, thereby forming an LC filter as shown in FIG. 20 (d).

While, a method of manufacturing an LC filter is explained in FIG. 19 and FIG. 20, an inductive component may be similarly manufactured unless a ceramic chip capacitor is incorporated in the gap 35.

Figure 21:
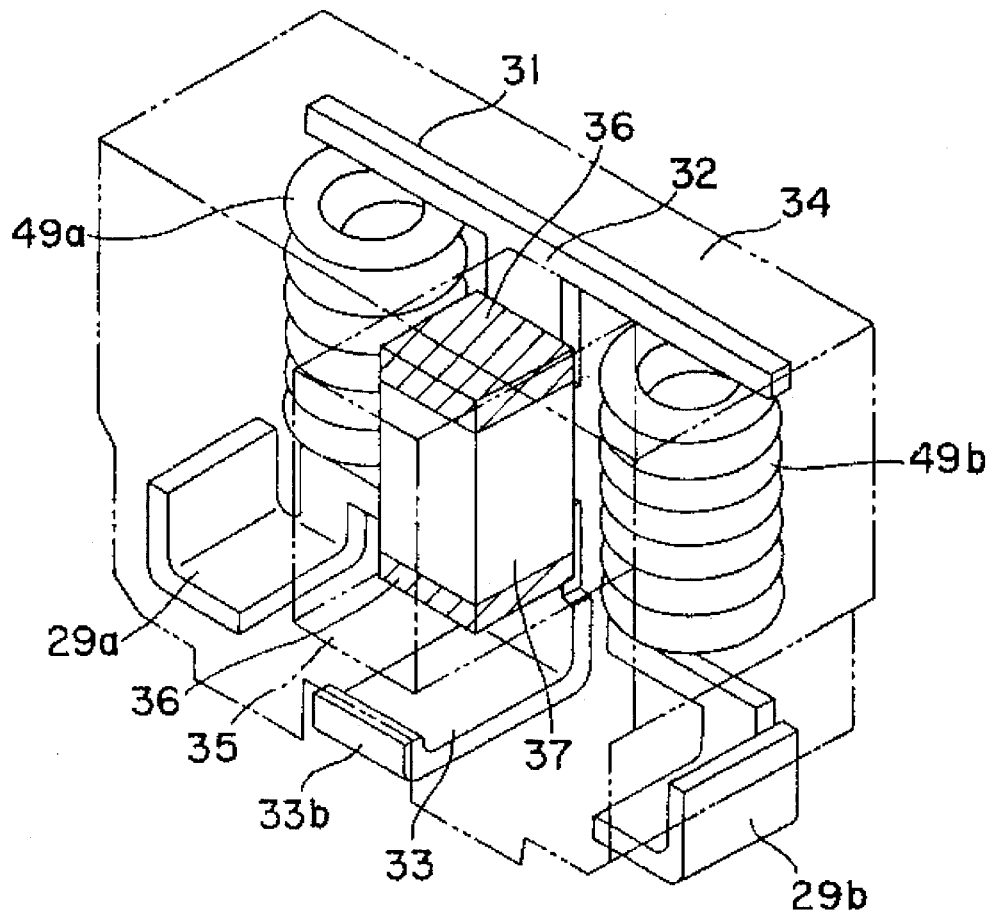
FIG. 21 is a partial perspective oblique view of an LC filter in accordance with an exemplary embodiment of the present invention.

In the foregoing exemplary embodiments, the inductive element 28 was formed by blanking an electric conductive hoop, but a larger inductance may be required depending on the application. An exemplary embodiment of LC filter with a larger inductance is explained by reference to FIG. 21.

Using an electric conductive hoop, first terminals 29a, 29b, connection part 31, electrode 32, and second terminal 33 are formed by blanking, and windings 49a, 49b composed of copper wire covered with an insulated film are connected between the first terminals 29a, 29b and the connection part 31. An exterior mold 34 is formed, and a ceramic chip capacitor 37 is incorporated in the gap 35 formed between the electrode 32 and the second terminal 33. The ceramic chip capacitor 37 is soldered and connected to the fronts of electrode 32 and second terminal 33, thereby forming an LC filter with a large inductance.

Figure 22:
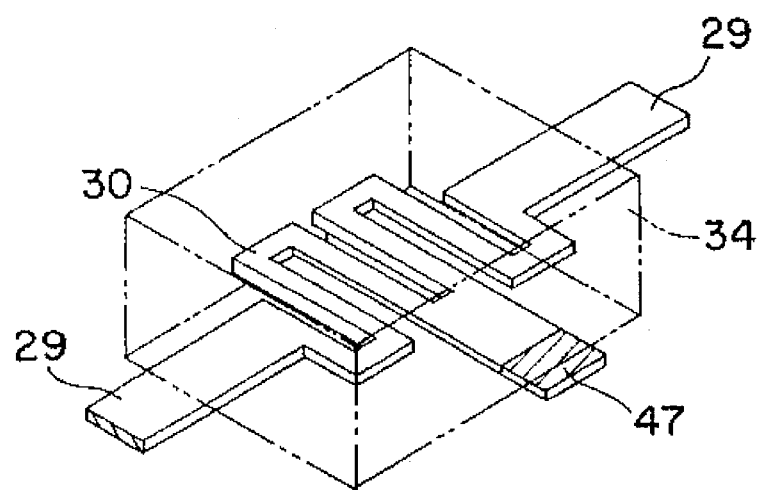
FIG. 22 is a partial perspective oblique view of a simple inductive component in accordance with an exemplary embodiment of the present invention.
Figure 23:
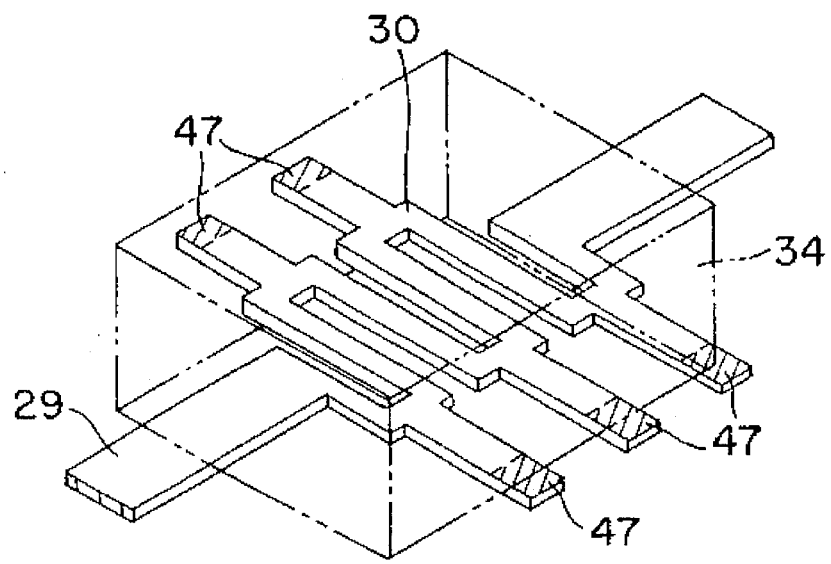
FIG. 23 is a partial perspective oblique view of a simple inductive component in accordance with an exemplary embodiment of the present invention.
Figure 24A:
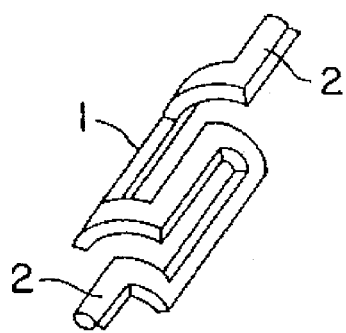
FIG. 24(a) is an oblique view of an inductive element in accordance with the prior art.
Figure 24B:
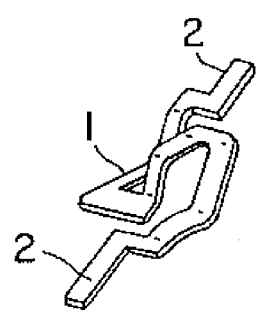
FIG. 24(b) is an oblique view of a further inductive element in accordance with the prior art.
Figure 24C:
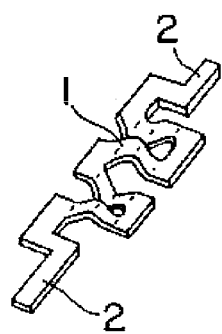
FIG. 24(c) is an oblique view of a third inductive element in accordance with the prior art.
Figure 25A:
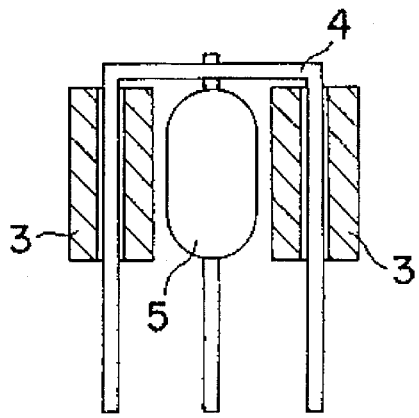
FIG. 25(a) is a sectional view of a further prior LC filter.
Figure 25B:
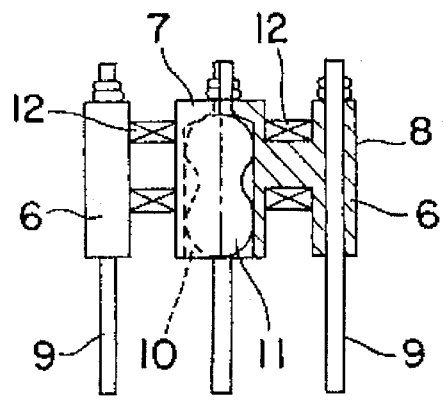
FIG. 25(b) is a partially cut-away front view of a further prior art LC filter.
Figure 25C:
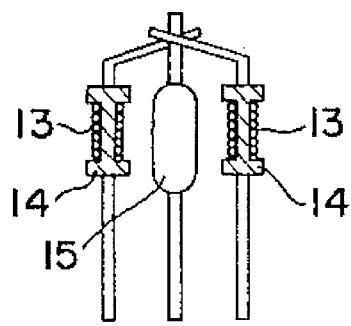
FIG. 25(c) is a sectional view of a third prior art LC filter.
Figure 25D:
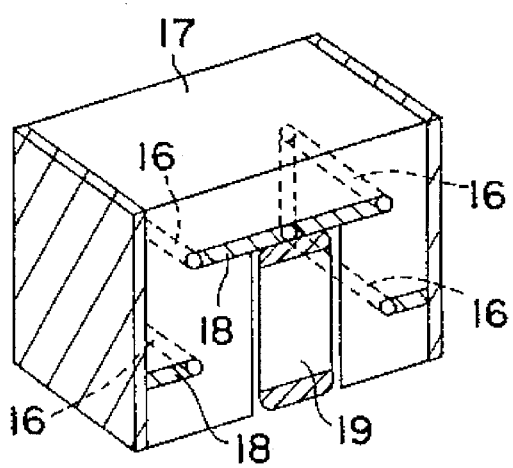
FIG. 25(d) is a partial perspective oblique view of a fourth prior art LC filter.
Figure 26A:
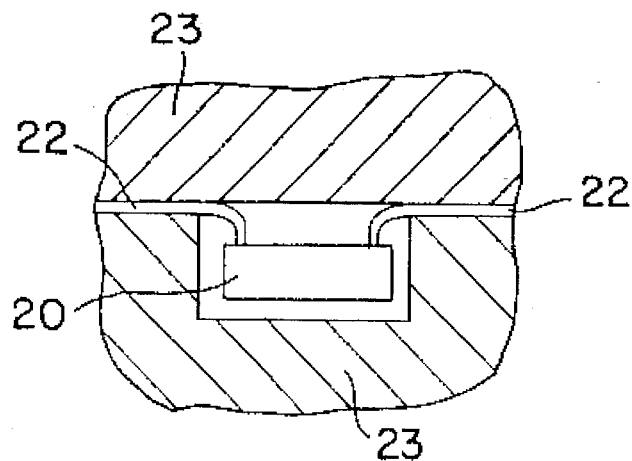
FIG. 26(b) is an oblique view of the electronic component shown in FIG. 26(a).
FIG. 26(c) is a further oblique view of the electronic component shown in FIG. 26(a).
FIG. 26(d) is a still further oblique view of the electronic component shown in FIG. 26(a).
Figure 26C:
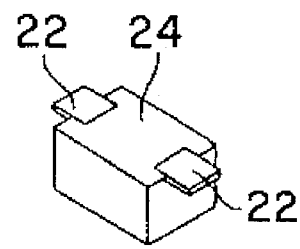
Figure 26B:
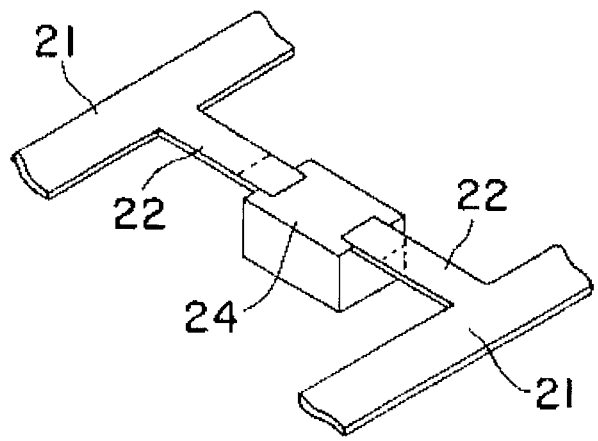
Figure 26D:
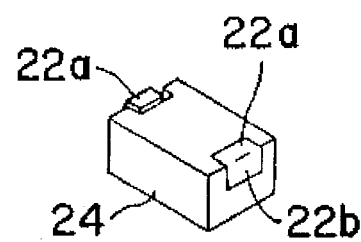
Figure 27:
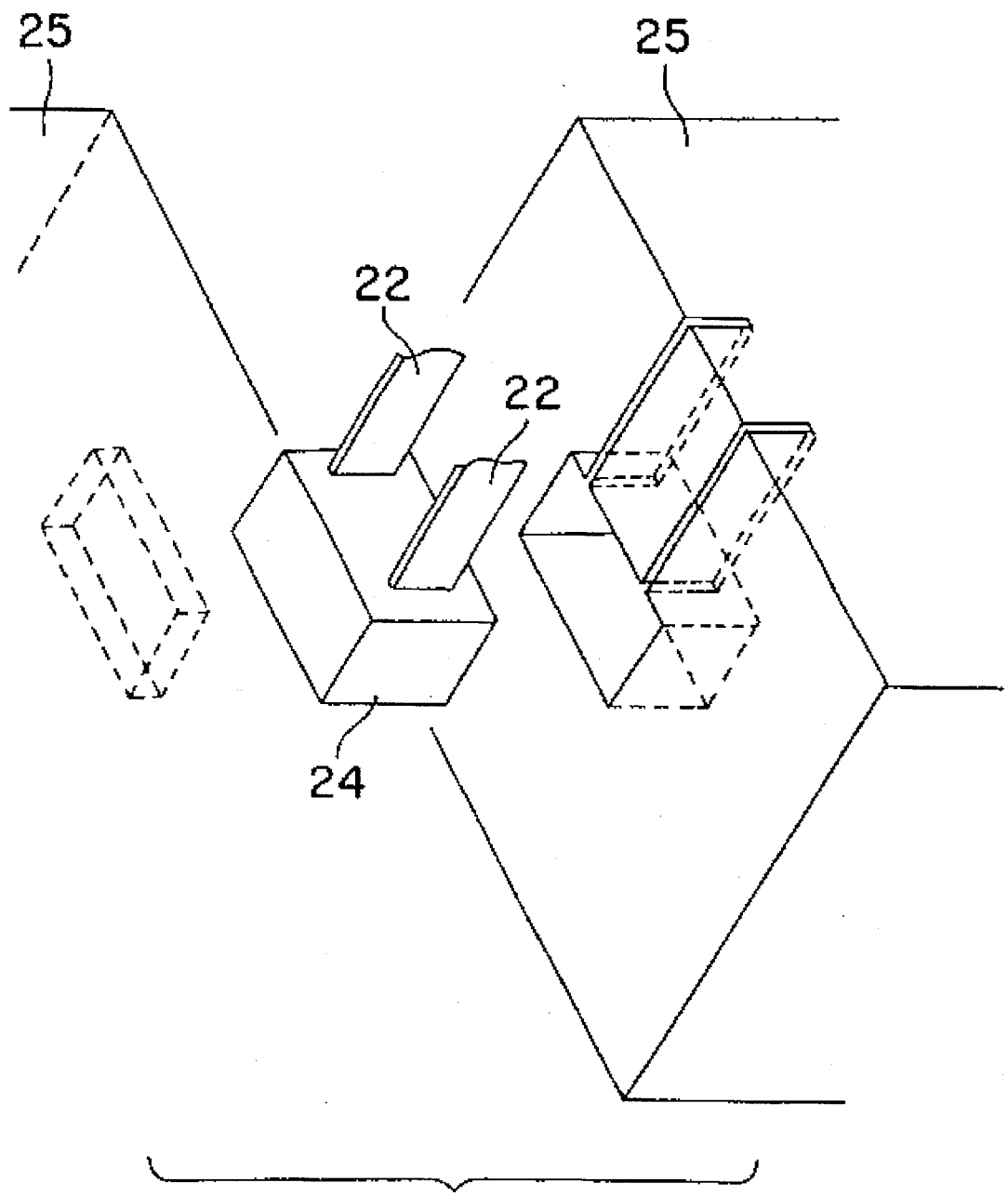
FIG. 27 is a partial perspective oblique view of a further prior art electronic component for surface mounting.
Figure 28A:
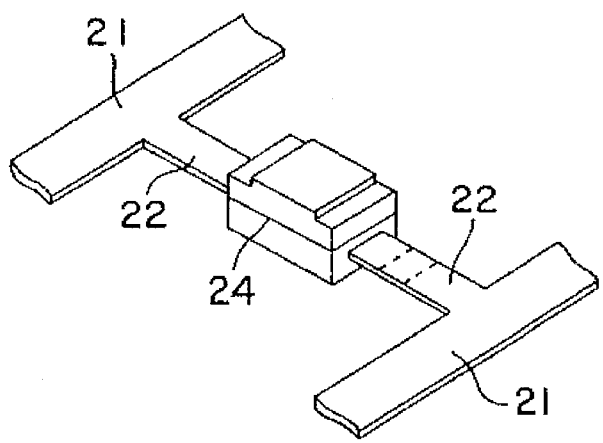
FIGS. 28(a)–(d) are oblique views of a third prior art electronic component for surface mounting.
Figure 28C:
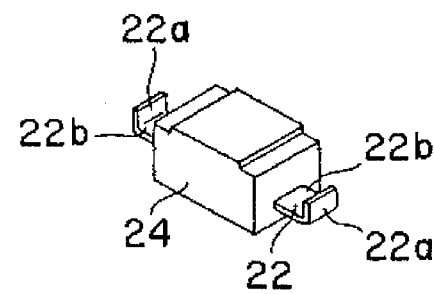
Figure 28B:
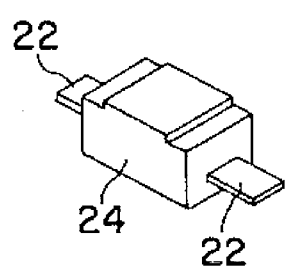
Figure 28D:
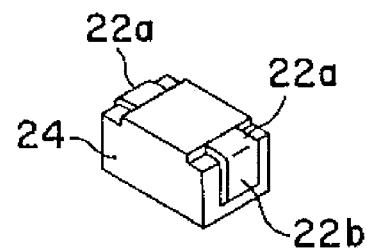

Moreover, an exemplary embodiment of a simple inductive component in accordance with the present invention is shown in FIG. 22 and FIG. 23, in which a pair of terminals 29 are provided at both ends of an electric conductive hoop, and zigzag part 30 is formed between the terminals. One or more outward projecting supporting elements 47 are disposed in the middle of zigzag part 30, and the terminals 29 and the supporting elements 47 are supported and fixed by molding dies when forming the exterior mold 34 to prevent the zigzag parts 30 from deforming, so that an inductive component with stable quality may be obtained.

Thus, according to the present invention, when forming the exterior mold, since the terminals and the electrode are supported and fixed by molding dies, deformation of the zigzag part is prevented, and therefore deformation of the inductive element is smaller than that of prior art. Furthermore the fluctuation of characteristics is small, and an electronic component of high quality may be manufactured at high productivity. In addition, the LC filter can be reduced in size because the capacitive element is incorporated into the gap of the exterior mold. Excellent productivity is obtained as well.

Furthermore, using an exterior mold made of a material including magnetic powder and because of the presence of the gap, the magnetic coupling is suppressed, and an inductive component which is small in attenuation is obtained. In addition, the trap attenuation is not enlarged due to increase of the loss (tan δ) of the capacitive element by eddy current. Thus, an LC component having extremely excellent characteristic may be obtained.

What is claimed is:

1. An electronic component comprising:
   an inductive element including a pair of zigzag parts,
   a pair of first terminals, one of said terminals connected to a first side of a first zigzag part of the pair of zigzag parts, and the other of said terminals connected to a first side of a second zigzag part of the pair of zigzag parts, a connection connected to a second side of the pair of zigzag parts, an electrode coupled to the connection, a second terminal provided on an extended portion of said electrode, and an exterior mold including an opening which exposes portions of said electrode and said second terminal.

2. An electronic component according to claim 1, wherein the exterior mold is formed from a resin which includes a magnetic powder.

3. An electronic component according to claim 1, wherein said exterior mold includes at least one indentation along a flank of said exterior mold and at least one of said first terminals and said second terminal are bent and formed in said at least one indentation.

4. An electronic component according to claim 1, wherein a supporting element is coupled to each of the pair of zigzag parts and to the exterior mold.

5. An electronic component according to claim 1, wherein the inductive element, the pair of first terminals, the connection, the electrode and the second terminal are made of an electric conductive hoop.

6. An electronic component comprising:

an inductive element including a pair of zigzag parts, a pair of first terminals, one of said terminals connected to a first side of a first zigzag part of the pair of zigzag parts, and the other of said terminals connected to a first side of a second zigzag part of the pair of zigzag parts, a connection connected to a second side of the pair of zigzag parts, an electrode coupled to the connection, a second terminal provided on an extended portion of said electrode, an exterior mold including an opening which exposes portions of said electrode and said second terminal, and a capacitive element connected between the second terminal and the electrode.

7. An electronic component according to claim 6, wherein a further electrode having a projection for positioning and supporting the capacitive element is provided in the opening of the exterior mold.

8. An electronic component according to claim 6, wherein at least one of the second terminal and the electrode is made of elastic metal.

9. An electronic component according to claim 6, wherein a dimension in the opening of the exterior mold is smaller at a fixing position than at an insertion position of the capacitive element.

10. An electronic component according to claim 6, wherein the capacitive element is coupled to a rib which is provided in the opening in the exterior mold.

* * * * *

UNITED STATES PATENT AND TRADE MARK OFFICE
CERTIFICATE OF CORRECTION

PATENT NO.   : 5,543,755
DATED        : August 6, 1996
INVENTOR(S)  : Yasushi Kumeji et al.

It is certified that error appears in the above-identified patent and that said Letters Patent is hereby corrected as shown below:

In Cover Page, [54] in the title, delete "INDICTIVE" and insert --INDUCTIVE--.

In Cover Page, [57] in the Abstract, line 6, delete "extensional position" and insert ---extended portion--.

Signed and Sealed this

Twenty-eighth Day of January, 1997

Attest:

BRUCE LEHMAN

Attesting Officer    Commissioner of Patents and Trademarks